(12) United States Patent  
Kim

(10) Patent No.: US 7,693,540 B2  
(45) Date of Patent: Apr. 6, 2010

(54) MOBILE TERMINAL HAVING CAMERA

(75) Inventor: Sul-Ran Kim, Anyang (KR)

(73) Assignee: LG Electronics Inc., Seoul (KR)

( * ) Notice: Subject to any disclaimer, the term of this patent is extended or adjusted under 35 U.S.C. 154(b) by 711 days.

(21) Appl. No.: 11/461,025

(22) Filed: Jul. 31, 2006

(65) Prior Publication Data

US 2007/0032260 A1 Feb. 8, 2007

(30) Foreign Application Priority Data

Aug. 6, 2005 (KR) .................. 10-2005-0072000

(51) Int. Cl.
*H04M 1/00* (2006.01)
(52) U.S. Cl. ................. 455/550.1; 455/90.3; 455/575.1
(58) Field of Classification Search ............ 455/90.3, 455/550.1, 575.1, 128, 347
See application file for complete search history.

(56) References Cited

U.S. PATENT DOCUMENTS

2003/0007333 A1* 1/2003 Kuchiishi et al. ........... 361/752
2005/0253923 A1* 11/2005 Komori et al. ........... 348/14.02
2005/0266892 A1* 12/2005 Schrack ................... 455/569.1

FOREIGN PATENT DOCUMENTS

| DE | 103 45 230 A1 | 4/2005 |
| EP | 1 148 716 A | 10/2001 |
| WO | WO-2004/066692 A1 | 8/2004 |

* cited by examiner

*Primary Examiner*—CongVan Tran
(74) *Attorney, Agent, or Firm*—Birch, Stewart, Kolasch & Birch, LLP

(57) ABSTRACT

A mobile terminal which includes a terminal body, a main printed circuit board (PCB) embedded in the terminal body, and a support member fixed to the main PCB and having a camera and a sub-PCB mounted thereto.

13 Claims, 4 Drawing Sheets

MOBILE TERMINAL HAVING CAMERA

This application claims the benefit of Korean Application No. 10-2005-0072000, filed on Aug. 6, 2005, which is hereby incorporated by reference in its entirety.

BACKGROUND OF THE INVENTION

1. Field of the Invention

The present invention relates to a mobile terminal having a camera and, more particularly, to a mobile terminal having a camera and a minimal number of components.

2. Description of the Related Art

Recently, in order to meet various demands of consumers, mobile terminals having various supplementary functions in addition to a basic communication function have been developed. For example, some mobile terminals have been provided with a camera for taking pictures, an MP3 player for reproducing music, and/or a Bluetooth device for performing short distance radio communication.

FIG. 1 is an exploded perspective view showing a related art mobile terminal.

The related art mobile terminal includes a display unit 104 having a display 102, and a terminal body 110 which is hingeably connected to the display unit 104 via a hinge connection 106.

The terminal body 110 includes a front cover 112 which is hingeably connected with the display unit 104, a rear cover 114 which is engaged with the front cover 112, a main printed circuit board (PCB) 116 and a sub-PCB 118 which are installed between the front cover 112 and the rear cover 114 and have components such as chips related to various supplementary functions mounted thereon, and a camera 120 which is mounted on the rear cover 114.

The sub-PCB 118 is electrically connected with the main PCB 116 by a connector, and spaced from the main PCB 116 and supported by a support member 130.

The camera 120 is inserted in a camera mounting unit 122 formed in the rear cover 114, and fixed to the rear cover 114 by a camera fixing member 124.

One of the drawbacks of a related art mobile terminal constructed as described above is that two components are required for supporting the sub-PCB 118 and fixing the camera 120 to the rear cover 114 (i.e., the support member 130 and the camera fixing member 124, respectively), which complicates the process of assembling the mobile terminal, and increases the cost of its fabrication.

Further, a related art mobile terminal constructed as described above utilizes space inefficiently.

SUMMARY OF THE INVENTION

In view of the foregoing, the present invention, through one or more of its various aspects, embodiments, and/or specific features or sub-components, is thus intended to bring out one or more of the advantages as specifically noted below.

An object of the present invention is to provide a mobile terminal equipped with a camera which has a minimal size, fabrication cost and assembling process.

To achieve at least this object, there is provided a mobile terminal which includes a terminal body, a main printed circuit board (PCB) embedded in the terminal body, and a support member fixed to the main PCB and having a camera and a sub-PCB mounted thereto.

A surface of the support member may be coated with an electromagnetic interference (EMI) pigment. The support member may include a main body having a front surface on which the camera is fixed and a rear surface which is mounted to the main PCB. The support member may include a rib which surrounds an area of the support member to which the camera is fixed and protects the camera.

The camera may be fixed to the support member with an adhesive. The adhesive may include a conductive material. The terminal may include a spacer which is disposed between the support member and the sub-PCB.

A rear surface of the support member may attach to the main PCB with an adhesive. The adhesive may include a conductive material. A ground part may be formed at a portion of the main PCB to which the support member is mounted. At least one guide hole or guide groove may be formed in the main PCB, and the support member may include at least one guide protrusion which is inserted in the at least one guide hole or guide groove formed in the main PCB.

The support member may include a sub-PCB support portion which is formed along an outer perimeter of a main body and supports the sub-PCB. The support member may include a rib which surrounds an area of the support member to which the camera is fixed, and the sub-PCB may include a cutaway into which the rib is inserted. A surface of the sub-PCB surrounding the cutaway may rest against the sub-PCB support portion. 15. The terminal may also include a spacer disposed between a surface of the sub-PCB surrounding the cutaway and the sub-PCB support portion.

There is also provided a method of assembling a mobile terminal having a main PCB and a sub-PCB, which includes attaching a camera to a support member, attaching the sub-PCB to the support member, and mounting the support member to the main PCB.

The method may include inserting the main PCB in a terminal body of the mobile terminal. Attaching the camera to the support member may include attaching the camera to an area of the support member surrounded by a rib. Attaching the sub-PCB to the support member may include inserting a portion of the support member into a cutaway of the sub-PCB. Inserting a portion of the support member into the cutaway of the sub-PCB may include inserting the rib into the cutaway of the sub-PCB.

Additional advantages, objects, and features of the invention will be set forth in part in the description which follows and in part will become apparent to those having ordinary skill in the art upon examination of the following or may be learned from practice of the invention.

BRIEF DESCRIPTION OF THE DRAWINGS

The present invention is further described in the detailed description that follows, by reference to the noted drawings by way of non-limiting examples of embodiments of the present invention, in which like reference numerals represent similar parts throughout several views of the drawings, and in which.

DETAILED DESCRIPTION OF THE INVENTION

Figure 1:
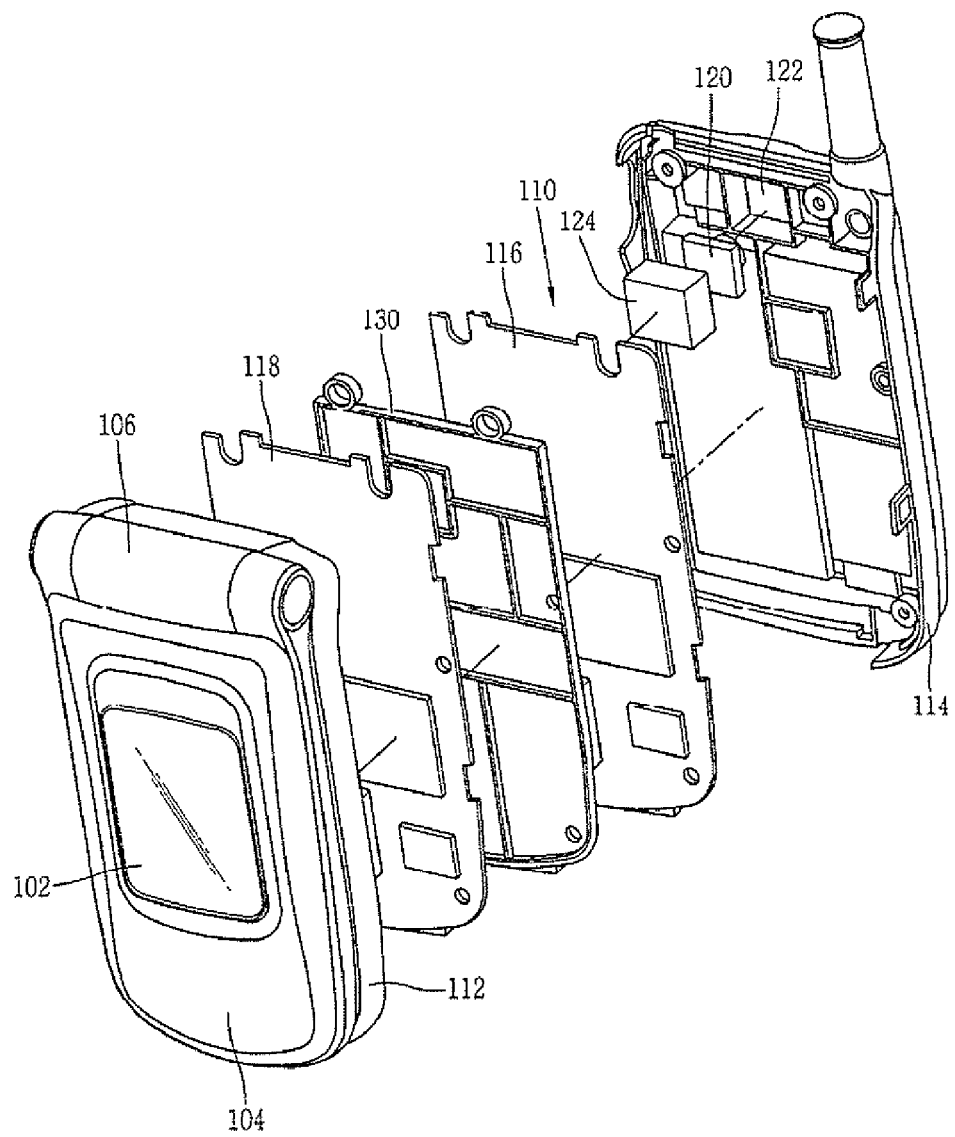
FIG. 1 is an exploded perspective view of a related art mobile terminal.
Figure 2:
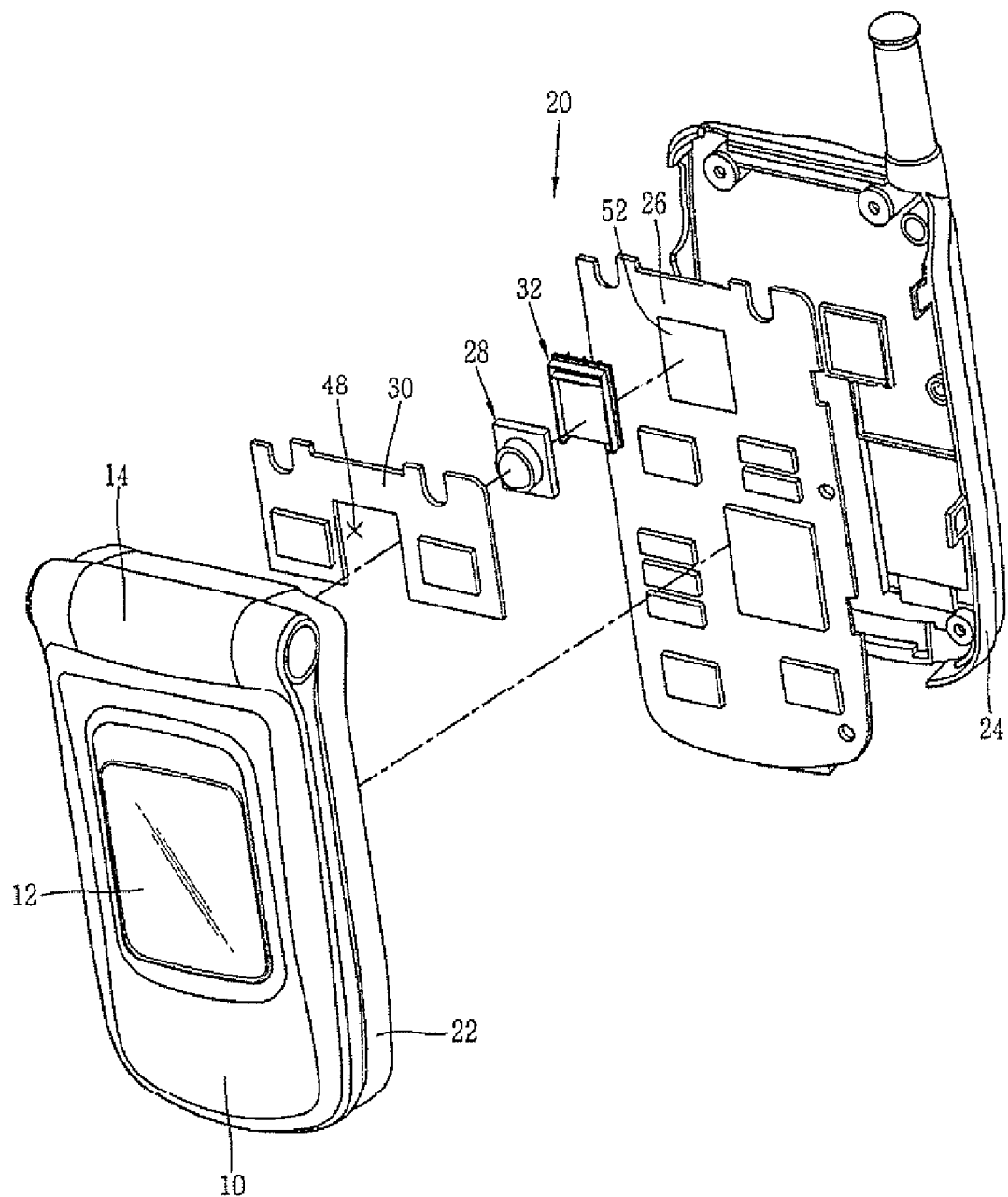
FIG. 2 is an exploded perspective view of a mobile terminal in accordance with an aspect of the present invention.

FIG. 2 illustrates a mobile terminal which includes a display unit 10 having a display 12, and a terminal body 20. The mobile terminal may be any mobile device which includes a camera, such as, but not, limited to a mobile phone or PDA. In the embodiment illustrated in FIG. 2, the display unit 10 is configured to open and close with respect to the terminal body 20. In some embodiments, the terminal body may have a key pad mounted on its front surface.

The terminal body 20 includes front and rear covers 22 and 24. A main printed circuit board (PCB) 26 is fixed between the covers 22 and 24, on which various circuit components are mounted, and a support member 32 is fixed on the main PCB 26, on which a camera 28 and a sub-PCB 30 are mounted.

The covers 22 and 24 include a front cover 22 which is connected to the display unit 10, and a rear cover 24 which is connected to the front cover 22. In one embodiment, the front cover 22 is hingeably connected to the display unit 10 by a hinge connection 14.

Figure 3:
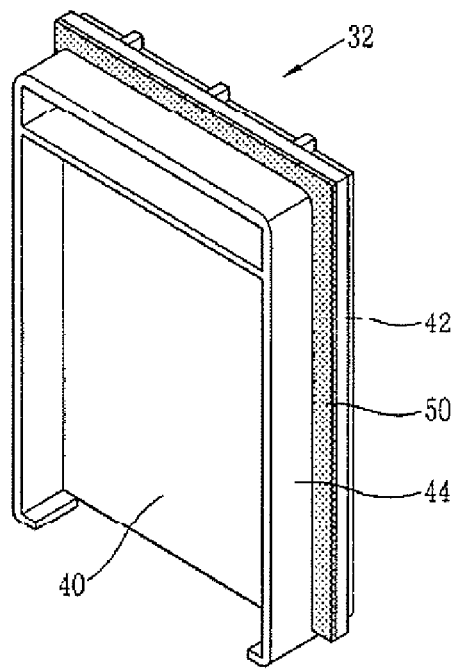
FIG. 3 is a perspective view of a support member in accordance with an aspect of the present invention.
Figure 4:
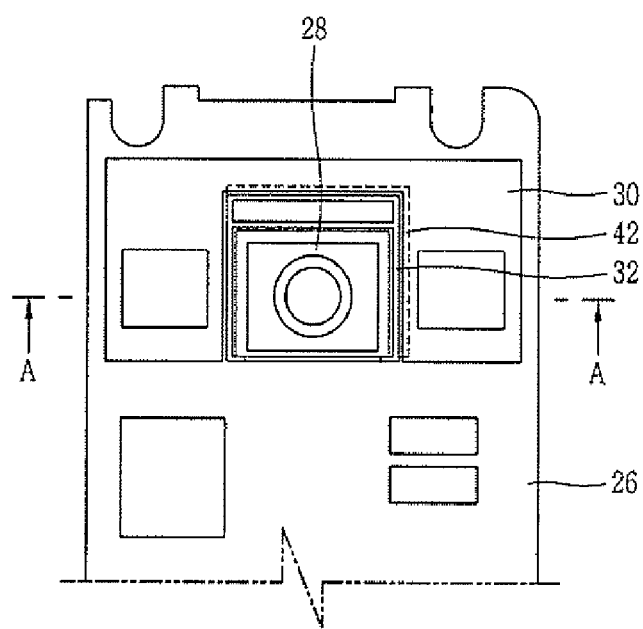
FIG. 4 is a front view showing the mounting of a camera and a sub-PCB to a support member in accordance with an aspect of the present invention.

FIG. 3 illustrates an embodiment of the support member 32 in which the support member 32 includes a main body 40 and a sub-PCB support portion 42. In this embodiment, the camera 28 fixes to a front surface of the main body 40, and a rear surface of the main body 40 mounts on the main PCB 26. The sub-PCB support portion 42 is formed along an outer perimeter of the main body 40 and supports the sub-PCB 30.

The front surface of the support member 32 may be coated with electromagnetic interference (EMI) pigments so as to be grounded with the main PCB 26. The camera 28, when mounted in the support member 32, is then grounded with the main PCB 26 so that static electricity generated from the camera 28 can be released through the main PCB 26.

The main body 40 includes a rib 44 which surrounds an area of the front surface of the main body 40 which the camera 28 fixes to. The rib 44 extends out a distance suitable to protect the camera 28 when it is fixed to the main body 40. In the embodiment illustrated in FIG. 5, the camera 28 adheres to the front surface of the main body 40 using an adhesive member 46. In one embodiment, the adhesive member 46 may be made of a double sided tape having a conductive material.

The sub-PCB support portion 42 protrudes along an outer perimeter of the main body 40 and supports the sub-PCB 30. The sub-PCB 30 includes a cutaway 48 which is substantially the same size and shape as the outer perimeter of the rib 44 of the support member 32, and allows the sub-PCB 30 to mount on the sub-PCB support portion 42 of the support member 32. When the sub-PCB 30 mounts on the sub-PCB support portion 42, the rib 44 is inserted into the cutaway 48 and the surface of the sub-PCB 30 surrounding the cutaway 48 rests against the sub-PCB support portion 42.

Figure 5:
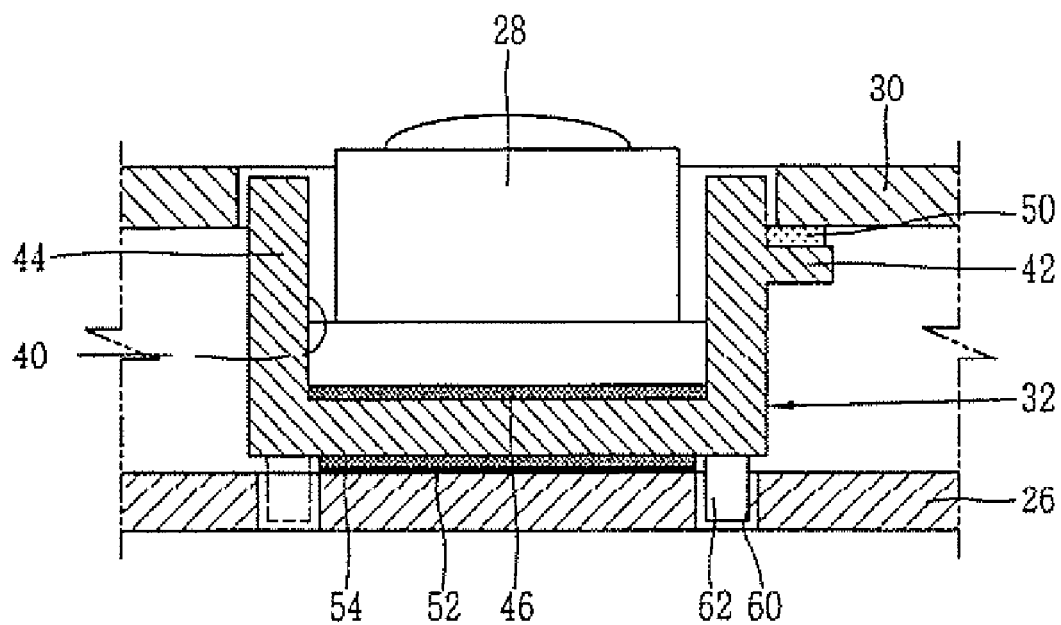
FIG. 5 is a sectional view taken along line A-A of FIG. 4.

The support member 32 is constructed such that a certain space is kept between the main PCB 26 and the sub-PCB 30 when the sub-PCB 30 mounts on the support member 32 and the support member 32 mounts on the main PCB 26. As shown in FIG. 5, this space is defined by the distance between the sub-PCB support portion 42 and the rear surface of the main body 40. The sub-PCB 30 electrically connects to the main PCB 26 with a connector (not shown).

In one embodiment, as shown in FIG. 5, a spacer 50 is disposed between the support portion 42 of the support member 32 and the sub-PCB 30 to prevent the sub-PCB 30 from being damaged. The spacer 50 may be a rubber material which attaches to the surface of the sub-PCB support portion 42.

In one embodiment, a ground part 52 is formed on a part of a surface of the main PCB 26 which comes into contact with the support member 32, as shown in FIG. 5. The support member 32 may attach to the ground part 52 with an adhesive member 54 formed on the rear surface of the main body 40 of the support member 32. In one embodiment, the adhesive member 54 may be a double sided tape made of a conductive material. This allows static electricity generated from the camera 28 to be released through the main PCB 26 via the adhesive members 46 and 54.

In one embodiment, guide holes or grooves 60 may be formed in the main PCB 26 for mounting the support member 32 to the main PCB 26. In this embodiment, corresponding guide protrusions 62 are formed on the rear surface of the main body 40 of the support member 32 and are configured to be inserted into the guide holes or grooves 60 of the main body PCB 26.

A process of assembling a mobile terminal constructed as described above will now be described as follows. First, the camera 28 is fixed to the main body 40 of the support member 32. Namely, the rear surface of the camera 28 is attached to the main body 40 of the support member 32 inside the rib 44. In one embodiment, the camera 28 attaches to the main body 40 with an adhesive member 46.

The sub-PCB 30 is then attached to the support member 32 such that the rib 44 is inserted into the cutaway 48 of the sub-PCB 30, and the surface of the sub-PCB 30 surrounding the cutaway 48 rests against the sub-PCB support portion 42 of the support member 32. In an embodiment in which a spacer 50 is attached to the sub-PCB support portion 42, the surface of the sub-PCB 30 surrounding the cutaway 48 rests against the spacer 50.

Then, the rear surface of the support member 32 is fixed to the main PCB 26. In an embodiment in which the main PCB 26 includes a ground part 50, and the rear surface of the support member 32 includes an adhesive member 54, the support member 32 is fixed to the main PCB 26 such that the adhesive member 54 fixes to the ground part 52.

After the sub-PCB 30, camera 28 and main PCB 26 are assembled, this assembly is fixed to the front and rear covers 22 and 24 of the mobile terminal, such that the lens of the camera 28 is positioned to face a window formed in the front cover 22 or rear cover 24. Although the embodiment illustrated in FIG. 2 shows the lens of the camera 28 facing the front cover 22, the assembly including the sub-PCB 30, camera 28 and main PCB 26 may alternately be oriented within the mobile terminal such that the lens of the camera 28 faces the rear cover 24.

By constructing a mobile terminal in a manner as described above, the number of components can be reduced. Thus, such a mobile terminal has the advantages of minimal size, fabrication cost and assembly process.

The illustrations of the embodiments described herein are intended to provide a general understanding of the structure of the various embodiments. The illustrations are not intended to serve as a complete description of all of the elements and features of apparatuses that utilize the structures described herein. Many other embodiments may be apparent to those of skill in the art upon reviewing the disclosure. Other embodiments may be utilized and derived from the disclosure, such that structural substitutions and changes may be made without departing from the scope of the disclosure. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The above disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

Although the invention has been described with reference to several exemplary embodiments, it is understood that the words that have been used are words of description and illustration, rather than words of limitation. As the present invention may be embodied in several forms without departing from the spirit or essential characteristics thereof, it should also be understood that the above-described embodiments are not limited by any of the details of the foregoing description, unless otherwise specified. Rather, the above-described embodiments should be construed broadly within the spirit and scope of the present invention as defined in the appended claims. Therefore, changes may be made within the metes and bounds of the appended claims, as presently stated and as amended, without departing from the scope and spirit of the invention in its aspects.

What is claimed is:

1. A mobile terminal, comprising:
   a terminal body;
   a main printed circuit board (PCB) embedded in the terminal body; and
   a support member fixed to the main PCB and having a camera and a sub-PCB mounted thereto,
   wherein the support member includes:
      a main body having a mount portion for mounting the camera, the main body being fixed to the main PCB; and
      a sub-PCB support portion for supporting the sub-PCB, the sub-PCB support portion being formed at the main body,
      wherein the sub-PCB support portion is formed along an outer perimeter of the main body, and
      wherein the support member comprises a rib which surrounds an area of the support member to which the camera is fixed, and the sub-PCB comprises a cutaway into which the rib is inserted.

2. The terminal according to claim 1, wherein a surface of the support member is coated with an electromagnetic interference (EMI) pigment.

3. The terminal according to claim 1, wherein the support member comprises a main body having a front surface on which the camera is fixed and a rear surface which is mounted to the main PCB.

4. The terminal according to claim 1, wherein the support member comprises a rib which surrounds an area of the support member to which the camera is fixed and protects the camera.

5. The terminal according to claim 1, wherein the camera is fixed to the support member with an adhesive.

6. The terminal according to claim 5, wherein the adhesive comprises a conductive material.

7. The terminal according to claim 1, further comprising a spacer which is disposed between the support member and the sub-PCB.

8. The terminal according to claim 1, wherein a rear surface of the support member attaches to the main PCB with an adhesive.

9. The terminal according to claim 8, wherein the adhesive comprises a conductive material.

10. The terminal according to claim 1, wherein a ground part is formed at a portion of the main PCB to which the support member is mounted.

11. The terminal according to claim 1, wherein at least one guide hole or guide groove is formed in the main PCB, and the support member comprises at least one guide protrusion which is inserted in the at least one guide hole or guide groove formed in the main PCB.

12. The terminal according to claim 1, wherein a surface of the sub-PCB surrounding the cutaway rests against the sub-PCB support portion.

13. The terminal according to claim 1, further comprising a spacer disposed between a surface of the sub-PCB surrounding the cutaway and the sub-PCB support portion.

* * * * *